United States Patent
Pontius (10) Patent No.: US 6,314,154 B1
(45) Date of Patent: Nov. 6, 2001

(54) NON-POWER-OF-TWO GRAY-CODE COUNTER AND BINARY INCREMENTER THEREFOR

(75) Inventor: Timothy A. Pontius, Lake in the Hills, IL (US)

(73) Assignee: VLSI Technology, INC, San Jose, CA (US)

(*) Notice: Subject to any disclaimer, the term of this patent is extended or adjusted under 35 U.S.C. 154(b) by 0 days.

(21) Appl. No.: 09/434,218

(22) Filed: Nov. 4, 1999

(51) Int. Cl.[7] ........................................... G07C 3/00
(52) U.S. Cl. ........................ 377/16; 377/26; 377/34
(58) Field of Search ............................. 377/16, 26, 34

(56) References Cited

U.S. PATENT DOCUMENTS

| | | | |
|---|---|---|---|
| 5,045,854 | * 9/1991 | Windmiller | 377/34 |
| 5,181,231 | * 1/1993 | Parikh et al. | 377/26 |
| 5,263,056 | * 11/1993 | Urbansky | 375/112 |
| 5,754,614 | 5/1998 | Wingen | 377/34 |
| 5,923,718 | * 7/1999 | Takahashi et al. | 377/34 |

* cited by examiner

Primary Examiner—Margaret R. Wambach
(74) Attorney, Agent, or Firm—Clifton L. Anderson (57) ABSTRACT

Non-power-of-two Gray-code counters, including modulos 10, 12, 14, and 22 are disclosed, along with a sequencing method they employ. Each counter includes a register for storing an N-bit, e.g., 4-bit, Gray-code count. The count is converted to binary code by a Gray-to-binary-code counter. The resulting binary count is incremented by an N-bit incrementer that skips certain binary values by toggling least-significant bits in unison when indicated by certain most-significant binary bits. The result is converted to Gray-code by a binary-to-Gray-code translator. The translated result is stored in the register as the next count. An algorithm is disclosed for designing such a Gray-code counter for any even modulo. The modulo is expressed as a sum of positive and negative terms, each term being a power of two. The exponents of the terms determine the counter design.

8 Claims, 6 Drawing Sheets

NON-POWER-OF-TWO GRAY-CODE COUNTER AND BINARY INCREMENTER THEREFOR

BACKGROUND OF THE INVENTION

The present invention relates to computers and, more particularly, to computer communications-interface devices. A major objective of the invention is to provide a scaleable design for Gray-code counters, such as those used as counters in computer communications buffers.

Much of modern progress is associated with advances in computer technology. As computers have become more powerful, they have been required to communicate increasingly with peripherals and other computers. Buffering computer communications allows a host computer to attend to other tasks on a time-multiplexed basis during a communications session. In addition, buffering can facilitate asynchronous communications and thus obviate a need for communicating devices to share a common time base.

Buffering is commonly accomplished using RAM-based FIFOs, a first-in-first-out (FIFO) device based in which data being communicated is temporarily stored in random-access memory (RAM). When a suitable unit, e.g., byte, of data is received by the FIFO, the data unit is stored at a FIFO address indicated by a write pointer.

Once that data is stored, the write pointer is incremented to the next address—which is where the next unit of data received will be stored. When a device is ready to read from the FIFO, it reads from a FIFO address indicated by a read pointer. After the data is read, the read pointer is incremented so that the next read is from the next FIFO address. Each pointer is basically a counter that counts data transfers. The counters are modulo in that they wrap to zero when a maximum count is reached.

Conventional binary-code counters can be used as FIFO pointers. Binary counter design has matured to the point where, once a few specifications (such as target count) are entered, a computer can yield an optimized counter design. A disadvantage of binary counters is that there can be considerable ambiguity when a count is read during a count transition. For example, when a count increments from 011=3 to 100=4, every bit value changes. However, the changes can take place at slightly different times across the bit positions. Any of eight possible 3-bit binary values might be read during this transition. Attempts to design around such extreme ambiguities can add considerable complexity to the counter or to circuit elements that respond to the counter.

An alternative to binary code called "Gray code" requires a change in only one bit position in the event of a unit increment. The following is a 3-bit Gray-code sequence: 0=000, 1=001, 2=011, 3=010, 4=110, 5=111, 6=101, 7=100. Incrementing the last value, 100, yields the first value 000. Since only one bit position changes during a unit increment, the only possible reads during a transition are the value being changed from and the value being changed to. It is much easier to design around this limited ambiguity than it is to design around the much more extensive ambiguities confronting binary counter reads.

Gray codes can readily be constructed for any bit length. A one-bit Gray code can be the same as a one-bit binary code. The sequence is 0,1. A two-bit Gray code can be derived from a one-bit Gray code by the following three-step algorithm. First, the sequence is copied to yield 0,1;0,1. Second, the second copy is reversed to yield 0,1;1,0. Third, leading zeroes are added to the values in the first copy and leading ones are added to the reversed values in the second copy to yield 00, 01, 11, 10. This is a two-bit Gray code. The three-step algorithm can be applied to the two-bit Gray code to yield the three-bit Gray code described above. The algorithm can be iterated to yield Gray codes of any desired bit length.

A problem with many Gray-code counter designs is that they tend to be complex and are not readily scaled. These problems are addressed by a Gray-code design disclosed by Wingen in U.S. Pat. No. 5,754,614. Wingen's Gray-code counter comprises a count register for storing a Gray-code value, a Gray-to-binary code translator for converting the stored Gray-code value to a corresponding binary-code value, a binary-code incrementer for incrementing the binary-code value, and a binary-Gray code translator for converting the incremented binary-code value to the corresponding Gray-code value.

Basically, the Wingen Gray-code counter adds two translators to a standard binary counter. Each translator consists of one XOR gate for each bit position other than the most-significant bit position. Thus, for an N-bit counter, the Wingen Gray-code counter can be derived from an existing binary-code counter design by adding 2N−2 XOR gates. The design is simple and is readily scaled simply by selecting a binary incrementer that corresponds to the desired bit length for the Gray-code counter.

A disadvantage of the Wingen Gray-code counter as well as other Gray-code counters (e.g., those referenced in the Wingen patent) is that, when the target FIFO depth is not a power of two, the FIFO design has excess capacity. For example, when a communication application only requires a FIFO depth of 78, the power-of-two limitation requires the use of a 128-address FIFO. In contrast, binary-code counters can be designed for any positive integer depth. The discrepancy between target and Gray-code-imposed capacities can be much greater for larger FIFOs.

The excess capacity can be costly in terms of integrated-circuit area that might otherwise be devoted to other functions. The incorporating integrated circuit can be less functional or more costly as a result. What is needed is a more favorable tradeoff between the low transition ambiguity associated with Gray-code counters and the fine scalability of binary-code counters.

SUMMARY OF THE INVENTION

The present invention provides a Gray-code counter with a binary incrementer that skips certain binary values in a manner that preserves the Gray-code nature of the incrementer output when translated to Gray-code. The present invention thus permits Gray-code counters of any even size. The concept behind the invention can be discerned by inspection of the following table:

TABLE I

| Modulo 6 Gray Code | | |
|---|---|---|
| Decimal Code | Binary Code | Gray Code |
| 0 | 000 | 000 |
| 1 | 001 | 001 |
| 2 | 010 | 011 |
| 3 | 011 | 010 |
| 4 | 100 | 110 |
| (5) | (101) | (111) |

TABLE I-continued

Modulo 6 Gray Code

| Decimal Code | Binary Code | Gray Code |
|---|---|---|
| (6) | (110) | (101) |
| 7 | 111 | 100 |

If no values are skipped, Table I corresponds to a 3-bit Gray-code counter with eight distinct values. The middle column corresponds to the incorporated binary-code incrementer. To achieve a Gray-code counter with six distinct values, the invention provides for skipping two values, e.g., decimal values 5 and 6, indicated by parentheses in Table I. Thus, when the decimal count is 4, the Gray-code count is 110, which is translated as binary-code 100. When this is incremented by the modified binary-code incrementer, the result is 7=111 binary code. This translates to 7=100 Gray code. Note that 7=100 Gray code differs from 4=110 at only the middle bit position. Thus the Gray-code nature of the count sequence is preserved.

While more than one skipping pattern can yield a desired result, the skipping cannot be arbitrary if Gray-code character is to be preserved. Furthermore, not all choices of binary values to skip can be implemented with equal elegance. Accordingly, the invention provides an algorithm that yields a counter with any selected even modulo number that is easily implemented by adding a small number of logic gates to a comparable Wingen Gray-code counter.

The algorithm begins with expressing the desired counter modulo M in the following form: $M=2^A-2^B+2^C-2^D+2^E\ldots$ The constraints on this expression are: 1) the exponents are positive integers such that A>B>C etc; 2) adjacent terms are of opposite sign; and 3) the series begins and ends with positive terms. Exponent A then determines the bit-length for the counter. A–B determines the number of most-significant bits (MSBs) to be used in controlling less-significant incrementer outputs. B–C determines the number of less-significant bits to be controlled by the most-significant bits determined in the previous step. The less-significant bits are preferably toggled with the least-significant bit (LSB).

If there are additional terms, C–D determines the number of additional most-significant bits to be used in determining less-significant outputs identified in the following step. D–E determines the number of additional less-significant bits to be controlled by the most-significant bits. In general, the difference between a positive term and the succeeding negative term determines the number of additional most-significant bits (MSBs) used for control, and thus the threshold at which skipping begins; the difference between a negative term and a succeeding positive term determines the number of additional least-significant bits (LSBs) to be controlled.

This method yields a binary-code incrementer for which most increments do not involve skipping. Skipping only occurs when a series of trailing zeroes occurs, and the skipping is effected by changing this series of trailing zeroes to ones. The skipping is not effected every time there is a series of trailing zeroes. Skipping is conditioned on the occurrence of predetermined combination of input bit values of significance greater than the least-significant bits being changed in unison.

When P trailing bits skip from all ones to all zeroes, the binary value jumps from the beginning a series of $2^P$ binary values to the end of that series. This results in an increment of $2^P-1$; in other words, the number of values skipped is always expressible as $2^P-2$, where P is the number of least-significant bits toggling in unison.

The present invention provides for Gray-code counters that have modulos that are not powers of two. This allows, for example, optimal FIFO sizes to be accommodated. In context, this can result in more effective use of integrated-circuit area and more functionality per integrated circuit. In addition, the invention provides a simple algorithm for designing a non-power-of-two counter. Thus, a computer program can readily generate counter designs in accordance with the invention for any modulo. These and other features and advantages are apparent from the description below with reference to the following drawings.

DESCRIPTION OF THE PREFERRED EMBODIMENTS

Figure 1:
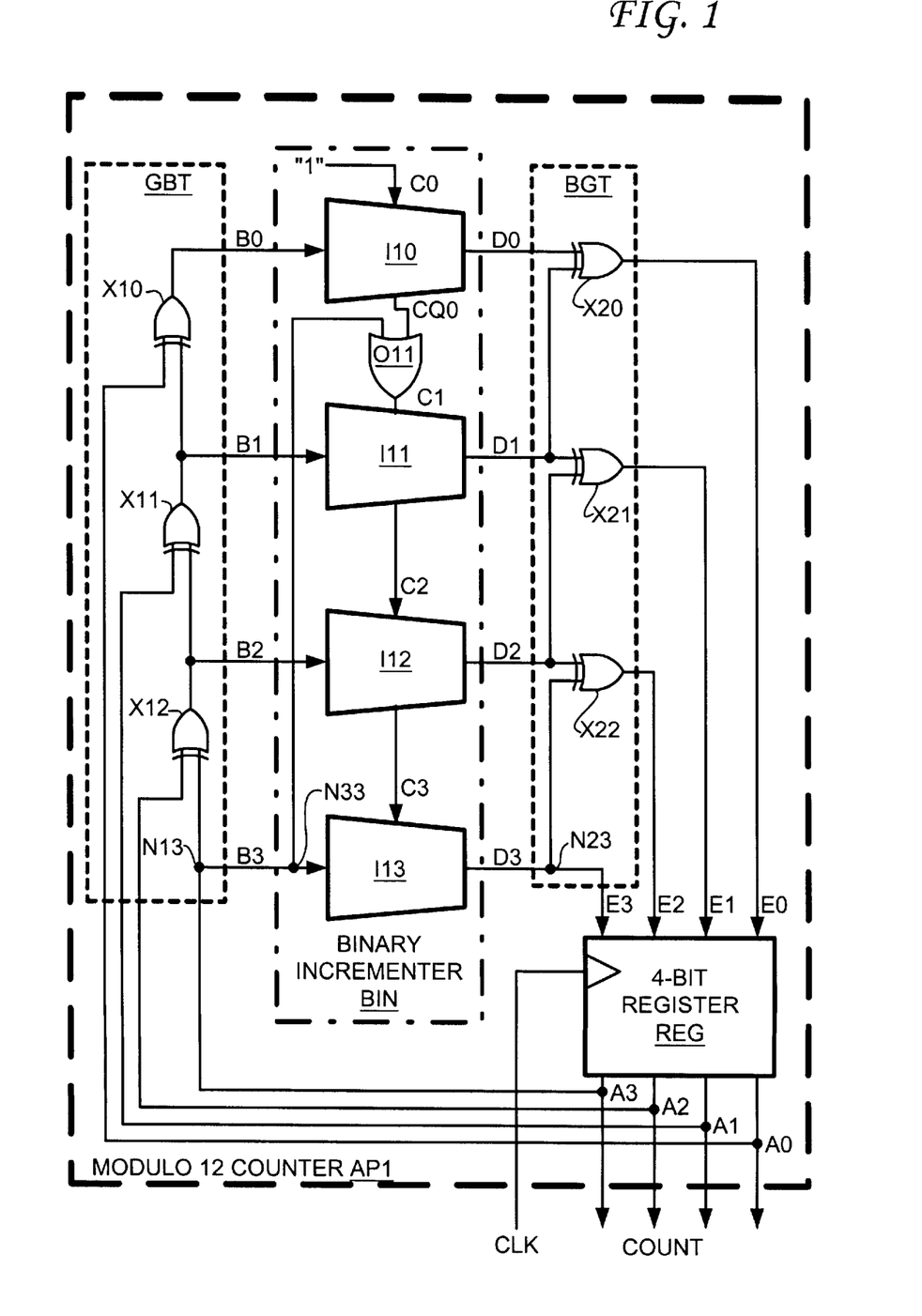
FIG. 1 is a logic diagram of a modulo 12 Gray-code counter in accordance with the present invention. The trapezoidal elements are 1-bit incrementers; in other words, they are one-operand adders. The base (left side) of a trapezoid is input for a single 1-bit operand; the narrow end is the one-bit output. The top is the carry in, and the bottom is the carry-out.

A modulo 12 Gray-counter counter AP1 comprises a 4-bit register REG, a Gray-to-binary-code translator GBT, a binary incrementer BIN, and a binary-to-Gray-code translator BGT, as shown in FIG. 1. Register REG stores a 4-bit Gray code, expressed as bit values A3, A2, A1, A0, in order of decreasing significance. This count is provided as the output of counter AP1.

The current count is also the input to Gray-to-binary-code translator GBT. Translator GBT converts Gray-code input A3, A2, A1, A0 to a binary equivalent output B3, B2, B1, B0. The most-significant binary bit is the same as the most-significant Gray-code bit, i.e., B3=A3. Accordingly, output B3 is coupled to input A3 via a hardwired node N13. Each of the three least-significant other bits, B2, B1, and B0 is determined by an exclusive ORing of the same-significance bit with the next most-significant bit of the binary output. In other words, B2=A2⊕B3, B1=A1⊕B2, and B0=A0⊕B1. The XOR combinations are implemented by respective XOR gates X12, X11, and X10.

Binary incrementer BIN converts the binary-code output B3, B2, B1, B0 of translator GBT to an incremented binary value D3, D2, D1, D0. In most (e.g., 10) cases, incrementer output D3, D2, D1, D0 is a unit greater than the incrementer input B3, B2, B1, B0, as with conventional incrementers. However, when the input corresponds to decimal 8, the output corresponds to decimal 11; when the input corresponds to decimal 12, the output corresponds to decimal 15. Thus, there are only twelve counts instead of the sixteen that would correspond to full use of a 4-bit binary code.

Binary incrementer BIN includes four one-bit incrementers I13, I12, I11, and I10. Each one-bit incrementer has two inputs: 1) a data input for receiving a respective binary input bit B3, B2, B1, B0; and 2) a carry input for receiving a respective carry input C3, C2, C1, C0. Each one-bit incrementer has two outputs: 1) a data output for outputting a respective one of the incrementer output bits D3, D2, D1, D0; and 2) a carry output. Each data output D3, D2, D1, D0 is the least-significant bit of the sum of the respective data and carry inputs. In the case that both the data and carry inputs are 1, the respective carry output is 1; otherwise, the carry output is zero. The carry output of one-bit incrementer I13 is not used.

The carry input C3 for incrementer I13 is the carry output of incrementer I12. Likewise, the carry input C2 for incrementer I12 is the carry output of incrementer I11. The carry input C0 for incrementer I10 is held at 1. (In some cases, it is desirable to freeze the count for one or more clock cycles; to this end, the loading of the input of register REG can be disabled for the duration of the desired freeze.)

The carry input C1 of incrementer I11 is the logical sum of the carry output CQ0 of incrementer I10 and most-significant input bit B3. To this end, binary incrementer BIN includes an OR gate O11 with one input coupled to the carry output of one-bit incrementer I10 and the other input coupled to a node N33 hardwired to input B3. The output of OR gate O11 is coupled to the carry input of incrementer I11.

The arrangement with OR gate O11 has the following effect. While B3 is zero, carry input C1 toggles in unison with input B0. The result is a normal series of unit increments up to binary 1000. At this point, carry input C1 is held high so output bits D1 and D0 toggle in unison. Binary incrementer BIN increments 1000 to 1011 (skipping 1001 and 1010). The next increment is a unit increment to 1100, but the next is to 1111 (skipping 1101 and 1110). The cycle is completed with a return to 0000 for the next increment. In all, four of sixteen 4-bit binary value are skipped each cycle. Accordingly, binary incrementer BIN is a modulo 12 counter.

Binary-to-Gray-code translator BGT is similar to Gray-to-binary code translator GBT in having three XOR gates and a hardwired node for the most-significant bit. One difference is that all of the XOR gates X22, X21, X20 of translator BGT have both of their inputs coupled to receive unmodified inputs to the translator. (For translator GBT, two XOR gates X11 and X10, have one input each coupled to the output of another XOR gate X12, X11, respectively.) Thus for binary-to-Gray-code translator BGT, having input bits D3, D2, D1, D0 and output bits E3, E2, E1, E0, E3=D3, E2=D2$\oplus$D3, E1=D1$\oplus$D2, and E0=D0$\oplus$D1. Upon receipt of a clock signal at its clock input, register REG replaces the predecessor Gray-code count A3, A2, A1, A0 with the successor Gray-code count E3, E2, E1, E0.

The following Table II, with skipped values in parentheses, demonstrates that counter AP1 yields a Gray code.

Table II

Output Sequence for Modulo 12
Gray-Code Counter AP1

| Decimal Equivalent | Binary D3,D2,D1,D0 | Gray E3,E2,E1,E0 |
|---|---|---|
| 0 | 0000 | 0000 |
| 1 | 0001 | 0001 |
| 2 | 0010 | 0011 |
| 3 | 0011 | 0010 |
| 4 | 0100 | 0110 |

Table II-continued

Output Sequence for Modulo 12
Gray-Code Counter AP1

| Decimal Equivalent | Binary D3,D2,D1,D0 | Gray E3,E2,E1,E0 |
|---|---|---|
| 5 | 0101 | 0111 |
| 6 | 0110 | 0101 |
| 7 | 0111 | 0100 |
| 8 | 1000 | 1100 |
| (9) | (1001) | (1101) |
| (10) | (1010) | (1111) |
| 11 | 1011 | 1110 |
| 12 | 1100 | 1010 |
| (13) | (1101) | (1011) |
| (14) | (1110) | (1001) |
| 15 | 1111 | 1000 |

As indicated by inspection of Table II, the first skip is from Gray-code 1100 to Gray-code 1110, which involves a change only at the E1 position. The second skip is from Gray code 1010 to 1000, which is also only a change at the E1 position. Thus, the sequence generated by counter AP1 conforms to a Gray code.

Figure 2:
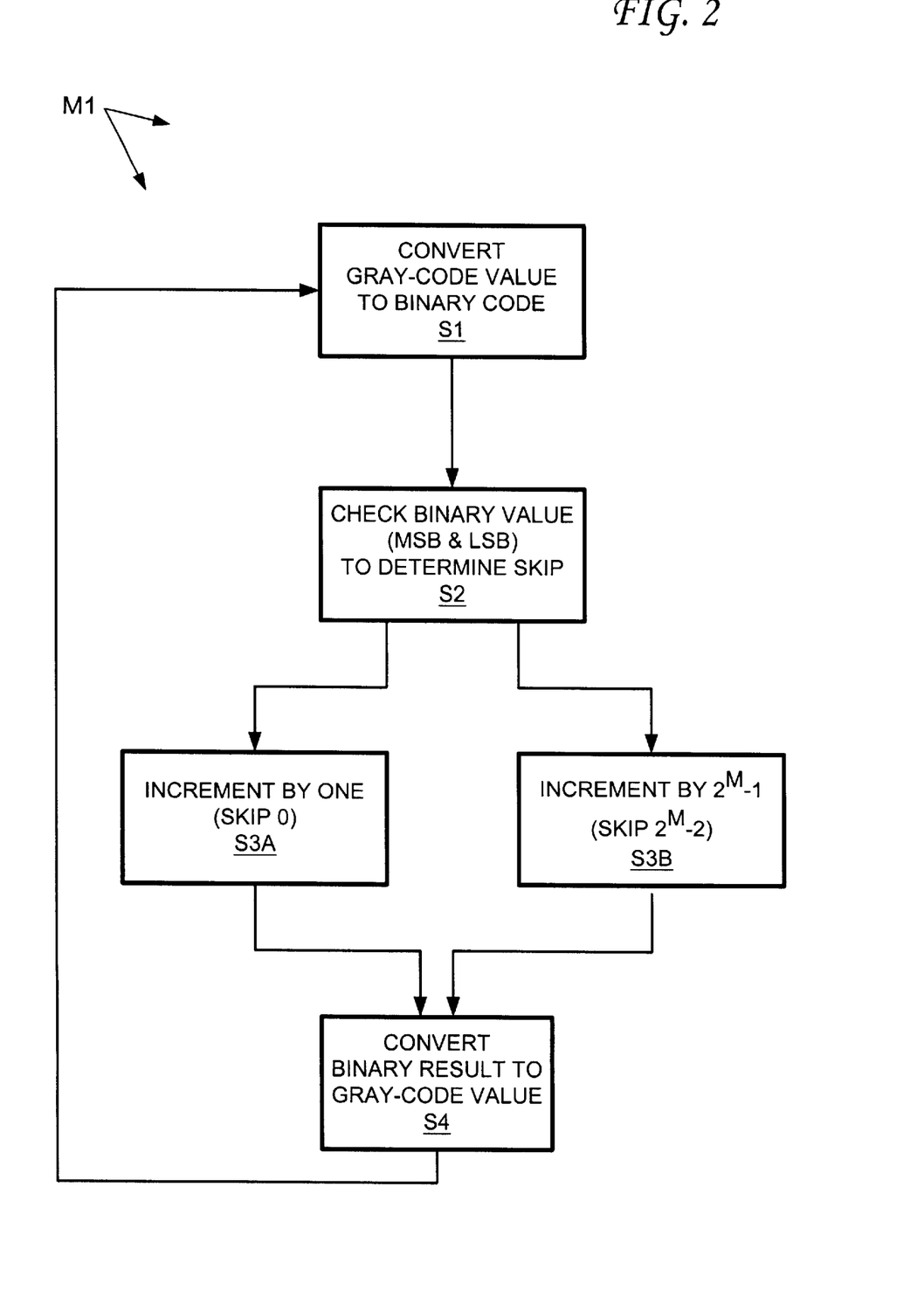
FIG. 2 is a flow chart of a method implemented by the Gray-code counter of FIG. 1 in accordance with the present invention.

Counter AP1 implements a method M1 flow-charted in FIG. 2. At step S1, a predecessor Gray-code value (A3, A2, A1, A0) is converted to a binary-code value (B3, B2, B1, B0). At step S2, the input to the incrementer is examined to determine whether or not a skip is in order. The most-significant bits are examined to determine if the skipping threshold has been met; if the skipping threshold is met, skipping occurs when the controlled least-significant bits are zeroes.

If the threshold is not met or if the least-significant bits are not zero, a unit increment results at step S3A. If the threshold is met and the least-significant bits are zeroes, a skip is effected at step S3B. In the case of counter AP1, only the most-significant bit B3 need be considered. The incremented binary code is converted to a successor Gray-code value at step S4. This successor Gray-code value becomes the predecessor Gray-code value for the next iteration of method M1.

Figure 3:
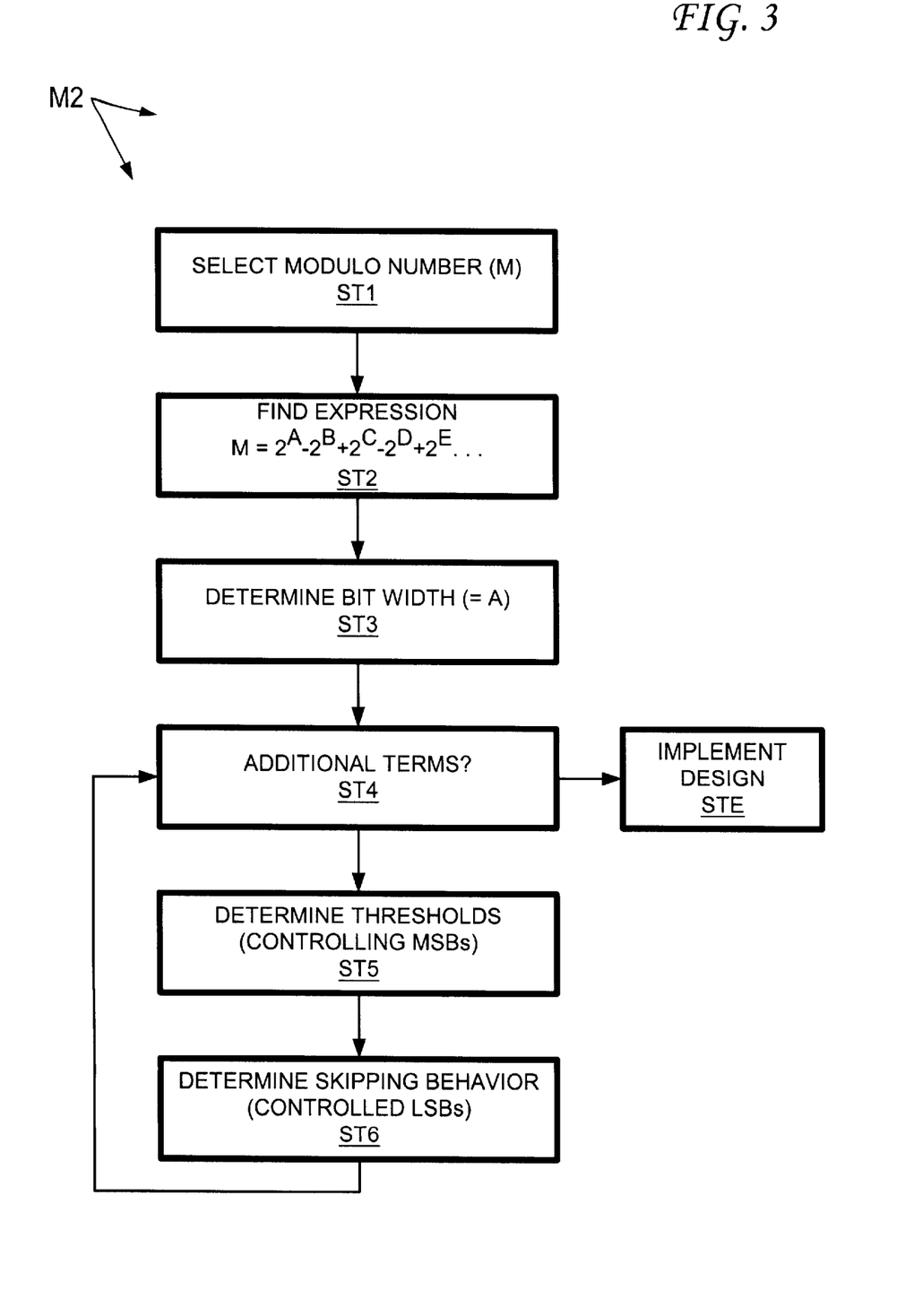
FIG. 3 is a flow chart of a method of designing non-power-of-two Gray-code counters.

The present invention provides a convenient method M2, flow charted in FIG. 3, for designing a Gray-code counter, such as counter AP1. At step ST1, an even-numbered modulo is selected. Since there are no Gray-code sequences with odd numerosity, odd-numbered modulos are not provide for.

The modulo is then expressed, at step ST2, as a series of diminishing powers of two, alternating between positive and negative terms, but beginning and ending with positive terms. The first positive term is the smallest power of two greater than or equal to the modulo number. (If the first positive term equals the modulo number, the resulting incrementer is conventional.) Each negative term involves the smallest power of two that results in an expression less than the modulo number. Each negative term is always followed by a positive term. Each positive term after the first is the smallest power of two that results in an expression greater than or equal to the modulo number. If the expression is equal, the final expression is obtained. Otherwise, another negative term is added. Note that this procedure converges since each term has a power of two less than that of the term before. In the case of modulo 12, the expression is $12=2^4-2^3+2^2$. For a modulo 22 example, the expression is $22=2^5-2^4+2^3-2^2+2^1$. For a modulo 78 example, the expression is $78=2^7-2^6+2^4-2^2+2^1$.

The bit-length for the counter is set at step ST3 equal to the power of the first term in the expression. For modulo 12, the bit length is 4, as it is for counter AP1. For modulo 22, the bit length is 5. In general, the bit length corresponds to the smallest power of two greater than or equal to the selected modulo.

Step ST4 determines whether or not there is an additional negative term. For the first iteration of ST4, if there is no negative term, the desired count is a power of two and a Wingen counter can be used. In this case, method M2 involves implementing the determined design at step STE—completing method M2. If there is a negative term, method M2 proceeds to step ST5.

Step ST5 determines the number of most-significant bits that are to affect the carry-ins of least-significant bits to be determined in the succeeding step ST6. For the first iteration of step ST5, the number of most-significant bits for controlling less-significant carry-ins is equal to the power of the first positive term less the power of the first negative term. In the case of modulo 12, this difference is 4−3=1, so one most-significant bit is used to control the carry-ins of the least-significant bits determined in the following step. Where the difference is two or more, the most-significant bits are ANDed together to control an OR gate coupled to an incrementer.

Step ST5 can be understood in the following way. The first negative term determines the number of binary values to be involved in skipping. In the case of modulo 12, eight of the sixteen binary values are to be used in skipping. Accordingly, incrementing proceeds through the first eight 4-bit binary values (beginning with 0) without skipping, but begins skipping upon reaching the first of the second eight 4-bit binary values (beginning with 1).

Step ST6 determines the number of less-significant bits to be affected by the most-significant bits determined in the previous step ST5. This number of less-significant bits to be controlled is equal to the difference between the power of the first negative term and the second positive term. In the case of modulo 12, this difference is 3−2=1, so that one 1-bit incrementer, corresponding to the second-most-significant bit, is to be controlled by the most-significant bit.

Method M2 then returns to step ST4 for the next iteration. In the case of modulo 12, all terms are taken into account and the method ends at step STE with the design for counter AP1 as shown in FIG. 1. Other features of method M2 are discussed with reference to modulo 14 and modulo 22 counters.

Figure 4:
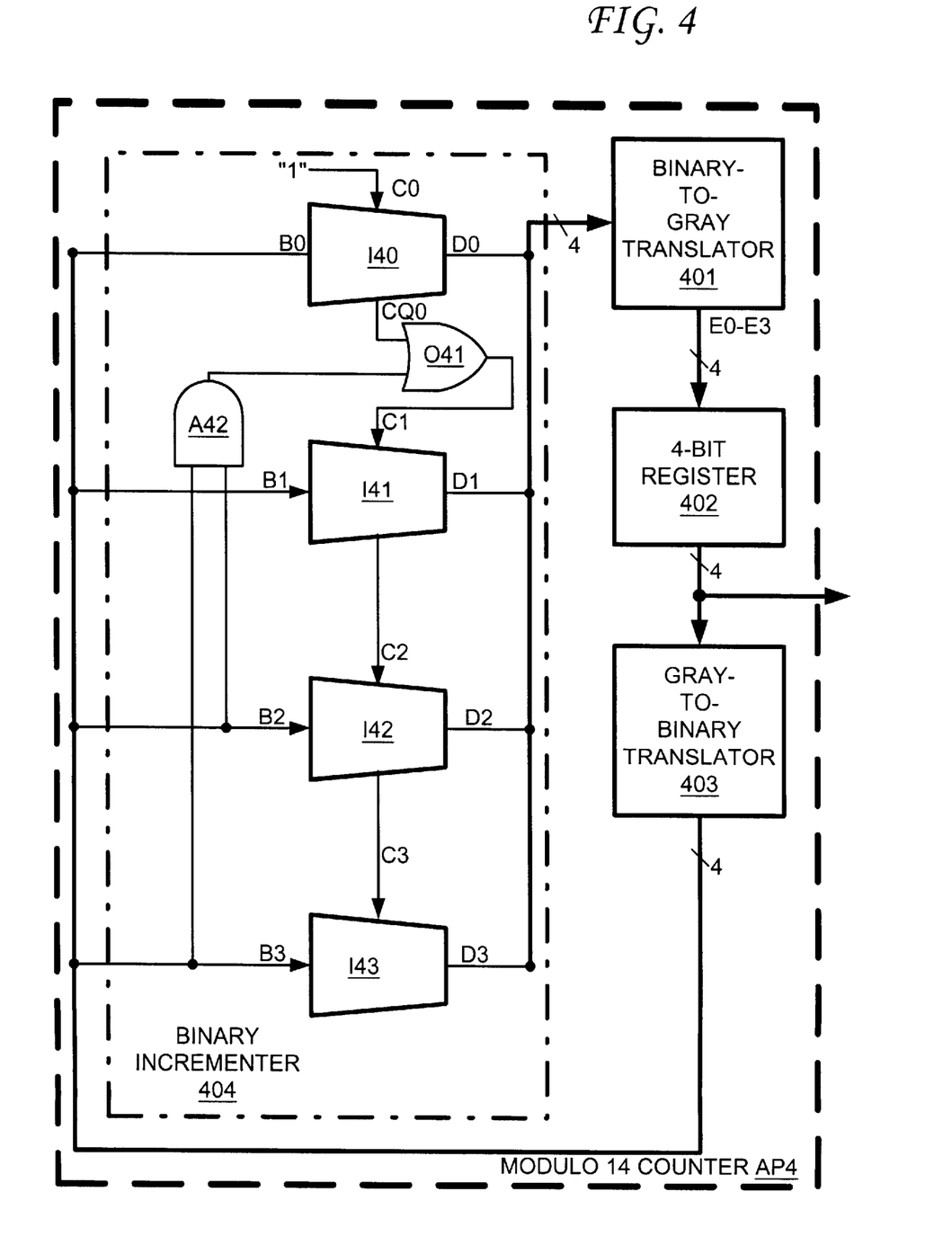
FIG. 4 is a logic diagram of a modulo 14 Gray-code counter in accordance with the present invention.

A modulo 14 counter AP4 in accordance with the present invention is shown in FIG. 4. Counter AP4 has a binary-to-Gray translator 401, a 4-bit register 402, a Gray-to-binary translator 403, and a binary incrementer 404. Counter AP4 differs from modulo 12 counter AP1 only in the design of binary incrementer 404, which includes bit incrementers I43, I42, I41, and I40.

In incrementer 404, one input to the OR gate, in this case OR gate O41, is coupled to an AND gate A42 instead of directly to an input line (e.g., line B3 as in incrementer BIN, FIG. 1). AND gate A42 has one input coupled to most-significant input line B3 and one input line coupled to second-most-significant input line B2. Thus, one input to OR gate O41 is the logical product of the two most-significant input lines to incrementer 404. The other input to OR-gate OR1 is the carry-out CQ0 from incrementer I40. The operation of counter AP4 can be discerned from the following Table III.

TABLE III

Output Sequence for Modulo 14
Gray-Code Counter AP4

| Decimal Equivalent | Binary D3,D2,D1,D0 | Gray E3,E2,E1,E0 |
| --- | --- | --- |
| 0 | 0000 | 0000 |
| 1 | 0001 | 0001 |
| 2 | 0010 | 0011 |
| 3 | 0011 | 0010 |
| 4 | 0100 | 0110 |
| 5 | 0101 | 0111 |
| 6 | 0110 | 0101 |
| 7 | 0111 | 0100 |
| 8 | 1000 | 1100 |
| 9 | 1001 | 1101 |
| 10 | 1010 | 1111 |
| 11 | 1011 | 1110 |
| 12 | 1100 | 1010 |
| (13) | (1101) | (1011) |
| (14) | (1110) | (1001) |
| 15 | 1111 | 1000 |

As indicated in Table III, for modulo 14 counter AP4, skipping does not begin until the two most-significant binary input bits B3 and B2 are both high (which occurs at decimal value 12). At that point there is one skip of two values (13 and 14) to decimal value 15. Once again the skip involves changing a pair of zeroes directly to a pair of ones. Skipping two of sixteen 4-bit binary values yields the desired numerosity of fourteen.

In terms of design method M2, the step ST3 expression for modulo 14 is $14=2^4-2^2+2^1$. Step ST5 determines that the 2-bit difference between the exponent of the positive term and the exponent of the first negative term is two, so the two most-significant bits (B3, B2) are required for control. Step ST6 determines that the difference between the exponents of the first negative term and the second positive term is one, so only the second-least-significant bit is controlled.

Figure 5:
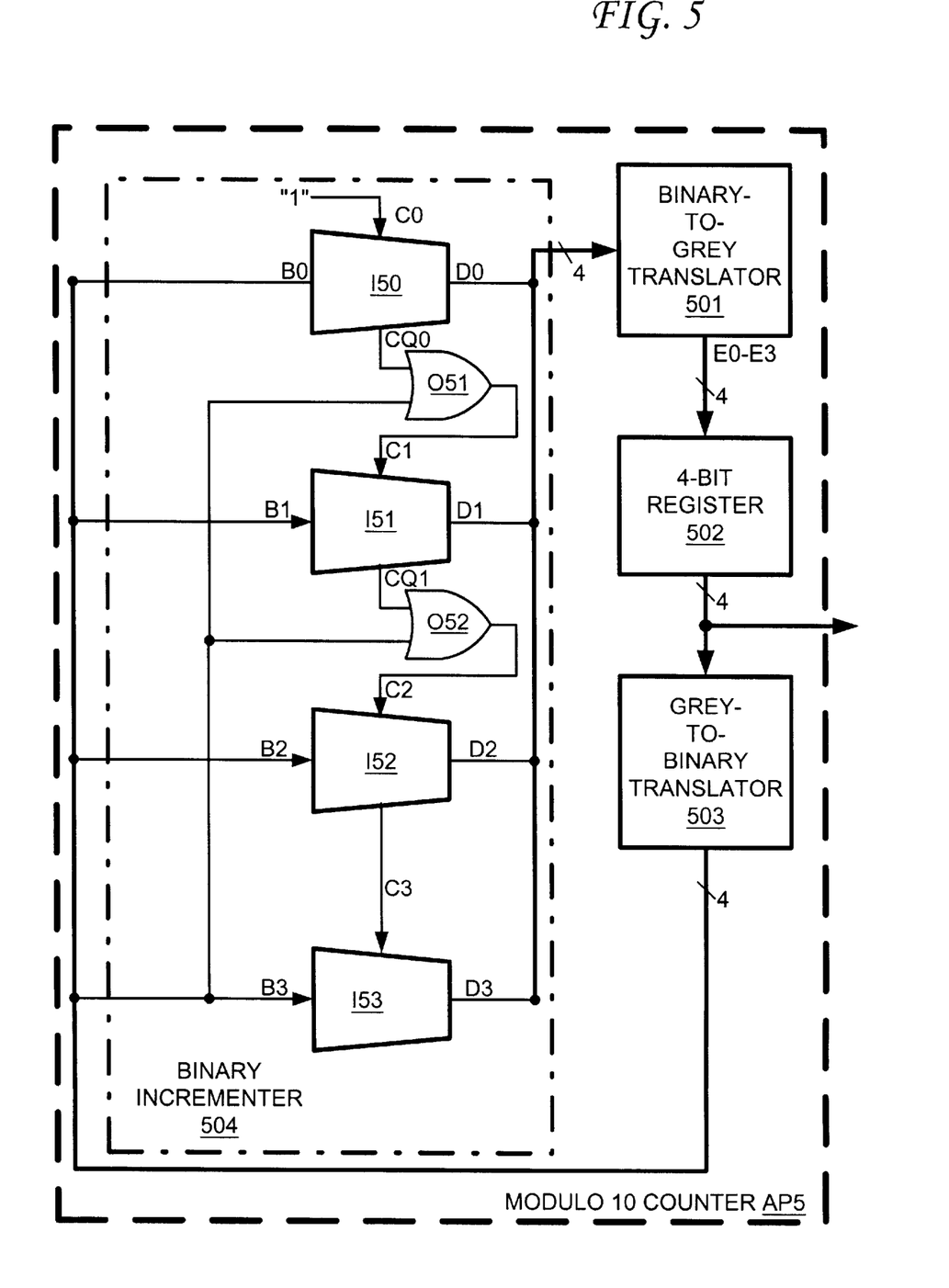
FIG. 5 is a logic diagram of a modulo 10 Gray-code counter in accordance with the present invention.

A modulo 10 counter AP5 in accordance with the invention comprises a binary-to-Gray translator 501, a 4-bit register 502, a Gray-to-binary translator 503, and a 5-bit binary incrementer 504. The difference between modulo 10 counter AP5 and the modulo 12 and 14 counters lies within incrementer 504. In this case, there are two OR gates, O51 and O52. OR gate O51 has one input coupled to the carry-out of a least-significant-bit incrementer I50, and the other to most-significant binary input bit B3. OR gate O52 has one input coupled to the carry-out of a second-least-significant incrementer I51 to receive a signal CQ1 therefrom, and the other input coupled to input B3. Thus, input B3 affects the carry-ins for incrementers I51 and I52. When B3 is high, the three least-significant bits toggle from 000 to 111 in unison. The following table IV illustrates the sequence generated by counter AP5.

Table IV

Output Sequence for Modulo 10
Gray-Code Counter AP5

| Decimal Equivalent | Binary D3,D2,D1,D0 | Gray E3,E2,E1,E0 |
| --- | --- | --- |
| 0 | 0000 | 0000 |
| 1 | 0001 | 0001 |
| 2 | 0010 | 0011 |
| 3 | 0011 | 0010 |
| 4 | 0100 | 0110 |

Table IV-continued

Output Sequence for Modulo 10 Gray-Code Counter AP5

| Decimal Equivalent | Binary D3,D2,D1,D0 | Gray E3,E2,E1,E0 |
|---|---|---|
| 5 | 0101 | 0111 |
| 6 | 0110 | 0l01 |
| 7 | 0111 | 0100 |
| 8 | 1000 | 1100 |
| (9) | (1001) | (1101) |
| (10) | (1010) | (1111) |
| (11) | (1011) | (1110) |
| (12) | (1100) | (1010) |
| (13) | (1101) | (1011) |
| (14) | (1110) | (1001) |
| 15 | 1111 | 1000 |

As indicated in Table IV, incrementer 504 performs unit increments up to 8=1000 and then skips six binary values to 15=1111. Note that the three least-significant bits toggle in unison. The jump is from Gray code 1100 to Gray code 1000, which is consistent with Gray code. Eliminating six values from 16 4-bit binary values yields the desired modulo 10 counter.

In the terms of design method M2, step ST3 yields the expression $10=2^4-2^3+2^1$. In step ST5, there is only a difference of 4−3=1 between the exponents of the first two terms. Thus, only the most-significant bit is used for control. In step ST6, there is a difference of 3−1=2 between the exponents of the third and second terms, so two least-significant bits (the second and third least-significant bits) are controlled by the most-significant bit.

Figure 6:
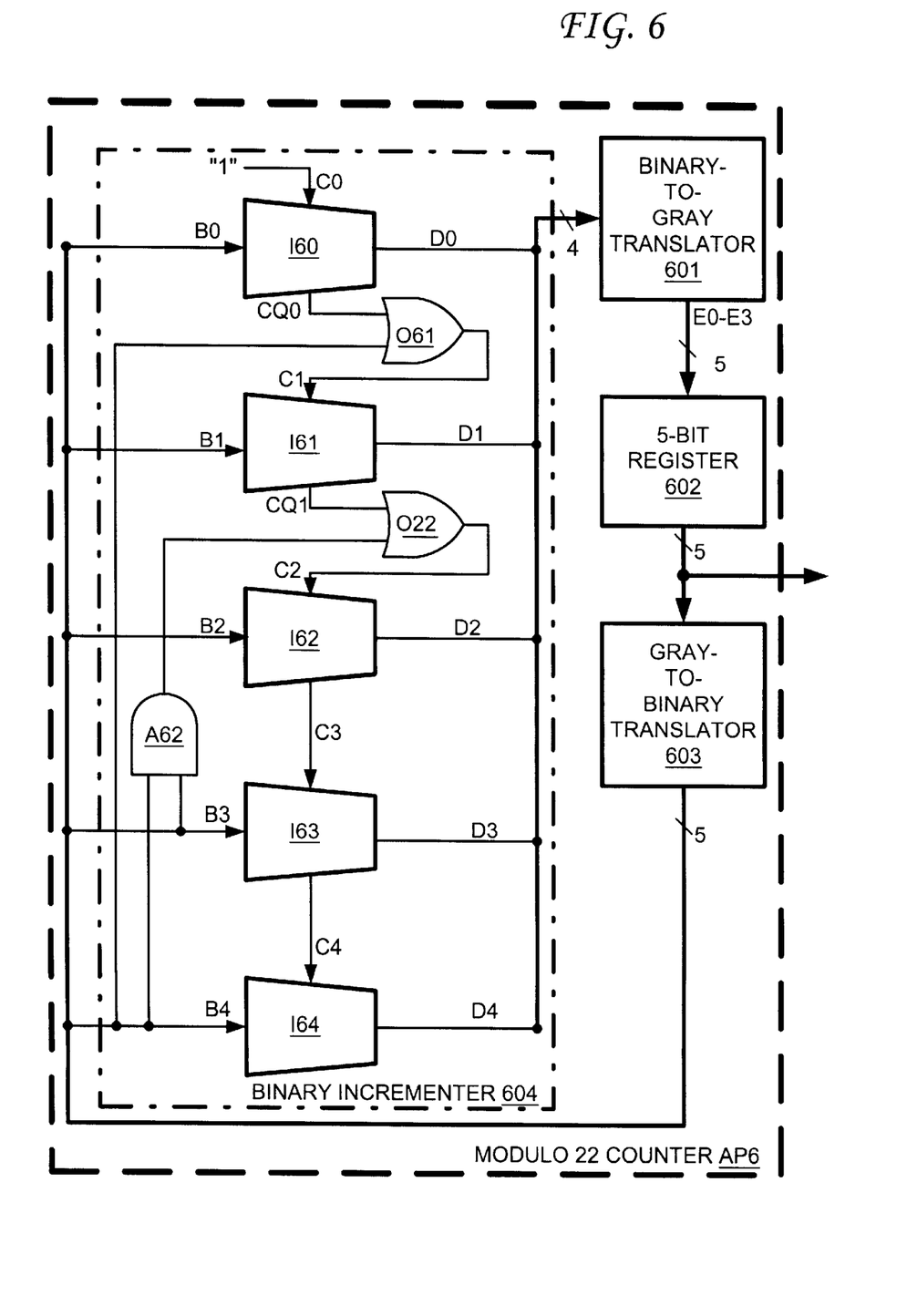
FIG. 6 is a logic diagram of a modulo 22 Gray-code counter in accordance with the present invention.

A modulo 22 counter AP6 in accordance with the invention comprises a binary-to-Gray translator 601, a register 602, a Gray-to-binary translator 603, and a binary incrementer 604, as shown in FIG. 6. All these components are 5-bits wide. Accordingly, incrementer 604 includes five one-bit incrementers I60, I61, I62, I63, and I64. In addition, it handles additional signals B4, C4 and D4, as shown.

Modulo 22 counter AP6 is designed in accordance with design method M2. The step ST3 expression is $22=2^5-2^4+2^3-2^2+2^1$. The exponent of the first term determines the 5-bit width of components for counter AP6. In the first iteration for step ST5, the difference 5−4 is 1, so only the most-significant bit is used to control the lesds-significant bits identified in the corresponding iteration of step ST6. In step ST6, the difference is 4−3=1, so only one less-significant bit is controlled. Accordingly, one incrementer, 161, has its carry-in affected by one input bit, B4.

Since there are additional terms, the second iteration of ST4 proceeds to step ST5. In method M2, any input bit line selected as a control line in one iteration is also used as a control line for any further iterations. The issue for each iteration of step ST5 is how many additional lines are to be required. This is determined by the difference in the exponents between the current negative term and the preceding positive term. In this modulo 22 case, this difference is 3−2=1. Thus, one additional control line is used in controlling additional less-significant bits determined in the corresponding iteration of step ST6.

For the second and subsequent iterations of step ST6, the difference between the negative term and the succeeding positive term determines the number of additional less-sigificant bits to be controlled. In the modulo 22 case, the difference is 2−1=1. Thus, one additional less-significant bit, the carry-in to the third least-significant bit is controlled. It is controlled by the logical product of the two most-significant bits. Method M2 then returns to step ST4, and terminates at step STE with the design of FIG. 6.

The invention provides for many ways of designing non-power-of-two Gray-code counters. The preferred method M2 is readily implemented by computer and minimizes the number of transitions encountered between incrementing modes (non-skipping, skipping 2s, skipping 6s, etc.). However, the invention provides for other skipping patterns consistent with Gray-code. Skipping can occur in the first portion of a sequence (e.g., skip when MSB=0), or alternate skipping and non-skipping in one pass through the count (e.g., using a bit other than the most-significant for control). The invention provides for out-of-phase Gray-code sequences that skip over zero, e.g., by toggling 101 to 010. These and other variations upon and modification to the described embodiments are provided for by the present invention, the scope of which is defined by the following claims.

What is claimed is:

1. A system comprising
an incrementer input for receiving an N-bit binary-code input value of input bit values each having a respective significance rank; and
a modulo incrementer for converting said N-bit binary-code input value to an N-bit binary-code output value of output bit values each having a respective significance rank, each of said N-bit output values including
a non-empty first set of output bit values that are completely determined by input bit values of equal and lesser significance, and
a non-empty second set of output bit values that are partially determined by an input bit value of greater significance, each bit value of said first set being of greater significance than every bit value of said second set.

2. A system as recited in claim 1 wherein said N-bit binary-code output value also includes a least-significant bit value that is completely determined by an input bit value of equal significance, said least-significant bit value being the only bit value of said N-bit binary output value not in one of said first and second sets.

3. A system as recited in claim 2 wherein said N-bit binary input value includes a most-significant input bit value, each bit value of said second set being partially determined by said most-significant input bit value.

4. A system as recited in claim 2 wherein said N-bit binary input value includes a third set of most-significant input bit values, each input bit value of said third set being of greater significance than all input bit values not in said third set, each output bit value of said second set being at least partially determined by an input bit value of said third set, every input bit value of said third set partially determining at least one output value of said second set.

5. A system comprising:
an incrementer input for receiving an N-bit binary-code input value of input bit values each having a respective significance rank;
a modulo incrementer for converting said N-bit binary-code input value to an N-bit binary-code output value of output bit values each having a respective significance rank, each of said N-bit output values including
a non-empty first set of output bit values that are completely determined by input bit values of equal and lesser significance, and a non-empty second set of output bit values that are partially determined by an input bit value of greater significance;

a Gray-to-binary code translator for providing said N-bit binary-code input value to said incrementer input as a function of a received predecessor Gray-code value;

storage means for storing Gray-code values, said storage means being coupled to said Gray-to-binary code translator for providing said predecessor Gray-code value thereto; and a binary-to-Gray code translator for converting said N-bit binary-code output value to a successor Gray-code value, said binary-to-Gray code translator being coupled to said storage means for replacing said predecessor Gray-code value with said successor Gray-code value.

6. A method of operating a modulo non-power-of-two Gray-code counter, said method comprising the steps of:

converting a predecessor N-bit Gray-code value to a corresponding predecessor N-bit binary-code value;

incrementing said predecessor N-bit binary-code value to obtain a successor N-bit binary-code value, said incrementing involving for most possible predecessor N-bit binary-code values, incrementing by 1, for all other possible predecessor N-bit binary-code values, incrementing by a respective amount expressible in the form $2^P-1$, where P is a positive integer less than N; and converting said successor N-bit binary-code value to a successor Gray-code count.

7. A method as recited in claim 6 wherein each step in which a predecessor N-bit binary code is incremented by more than 1 involves converting plural trailing zeroes to ones.

8. A method as recited in claim 7 wherein said predecessor N-bit binary code is incremented by more than 1 for some possible predecessor N-bit binary-code values with predetermined bit values at bit positions of greater significance than those of said plural trailing zeroes but not for other possible predecessor N-bit binary-code values not having said predetermined bit values at said bit positions of greater significance than those of said plural trailing zeroes.

* * * * *